United States Patent [19]

Nitescu et al.

[11] Patent Number: 5,641,375

[45] Date of Patent: Jun. 24, 1997

[54] PLASMA ETCHING REACTOR WITH SURFACE PROTECTION MEANS AGAINST EROSION OF WALLS

[75] Inventors: Petru N. Nitescu; Hoan Hai Nguyen, both of Milpitas, Calif.

[73] Assignee: Applied Materials, Inc., Santa Clara, Calif.

[21] Appl. No.: 291,369

[22] Filed: Aug. 15, 1994

[51] Int. Cl.$^6$ .................................................. H01L 21/3065
[52] U.S. Cl. ........................ 156/345; 216/67; 438/731
[58] Field of Search .......................... 156/345 P, 643.1, 156/646.1; 216/67, 79

[56] References Cited

U.S. PATENT DOCUMENTS

| | | | |
|---|---|---|---|
| 3,623,968 | 11/1971 | Bohne | 204/197 |
| 4,473,455 | 9/1984 | Dean et al. | 156/345 P |
| 5,047,115 | 9/1991 | Charlet et al. | 156/643.1 |
| 5,082,547 | 1/1992 | DeLarge | 156/345 P |
| 5,085,727 | 2/1992 | Steger | 156/643.1 |
| 5,099,100 | 3/1992 | Bersin et al. | 156/345 P |
| 5,330,607 | 7/1994 | Nowicki | 156/345 P |
| 5,348,587 | 9/1994 | Eichman et al. | 156/345 P |

*Primary Examiner*—T. Tung
*Attorney, Agent, or Firm*—Michaelson & Wallace

[57] ABSTRACT

A thin flexible removeable shield made of electrically conducting material presses against the interior walls of an apertured processing chamber to protect the processing chamber walls from erosion from the reactive plasma gases. The shield and walls are electrically interconnected with a sleeve-like conductive insert overlapping a surface portion of the shield and passing through the shield and lining a chamber aperture, with the insert also insuring the positioning of the insert against the wall. The remaining exposed surface of the shield has a protective anodization. A conductive connector preferably also connects the insert to another interior chamber structure at the same electrical potential as the chamber walls.

29 Claims, 5 Drawing Sheets

PLASMA ETCHING REACTOR WITH SURFACE PROTECTION MEANS AGAINST EROSION OF WALLS

BACKGROUND OF THE INVENTION

1. Field of the Invention

The present invention relates to the field of substrate processing using a plasma. More specifically, the invention relates to an apparatus for protecting the walls of a processing chamber having interior walls subject to erosion, general wear and contamination of the chamber walls from chemical reactions and physical effects of plasma processing.

2. Background of the Art

Plasma processing is used in the manufacture of various types of articles including semiconductor integrated circuit devices. Plasmas may be used to provide ions to sputter a target and thereby free atoms or larger particles of target material for deposition on a surface such as a semiconductor substrate. Plasmas may also be used to provide an environment for etching layers of material formed on a surface such as a semiconductor substrate. The plasma may be created by flowing a quantity of gas through a vacuum chamber maintained at a subatmospheric pressure, e.g., $10^{-3}$ Torr, and then exciting the gas with an electric field to disassociate the gas molecules to provide free gas ions and excited state species. The chamber must of course be constructed of a rigid metal, often aluminum, in order to contain such a quasi vacuum. The chamber is supplied with gases for processing the articles and a source of electric current. Often such a plasma processing chamber accommodates single articles at a time, but the chamber can also be designed for processing a plurality of articles simultaneously.

In some plasma processes, the gases used, as well as the presence of ions in the plasma, can cause erosion and wear of the reaction chamber walls. Also the metal material of the chamber walls, if exposed to corrosive gases or plasma, could react with the gases or plasma and form undesirable byproducts contaminating the processing chamber. One prior art approach to this problem is to anodize the chamber walls in order to provide a substantially inert surface on the metal walls. Moreover, anodization provides a hardness to the metal wall surface that enables the wall surfaces to withstand ion sputtering more effectively than without anodization. Eventually, however, the anodized layer is sputtered or etched off, since even an anodized surface still is subject to some degree of reactivity with the gases or plasma. Once the anodization wears off, the chamber itself must be replaced.

To prolong the lifetime of the chamber walls, shields are used to cover and thereby protect the walls from the gases and the plasma. These shields are formed preferably from material similar to that of the wall, and are anodized on the outer surfaces. The shields are placed inside the chamber as close as possible to the walls so that the wall material is protected from the action of the plasma and gases. However, the shields do not make effective electrical contact with the walls. The rigidity of the shields makes it more likely that corrosive or depositing gases can reach the wall through voids between the shields and wall because the rigidity of the shield prevents the shield from fully conforming to the contours of the wall. The lack of an effective electrical connection to the walls causes the shields to electrically float in the plasma, thereby creating a surface on which electrical charge could build and eventually form an arc in the plasma due to the charge leaking to another part of the chamber. Such plasma arcing is potentially highly damaging to the interior of the processing chamber or to the substrate being processed.

There is a need for a protective shield for the chamber walls that effectively protects the walls from wear and corrosion by minimizing the ability of gases and plasma to come into contact with the walls. It would be additionally very desirable to design a shield to minimize arcing. It would be advantageous if the shield were in addition inexpensive and easy to remove and install.

SUMMARY OF THE INVENTION

The invention provides a method and apparatus for protecting the interior walls of a plasma processing reactor from erosion caused by the plasma and/or the gases used to form the plasma. A removable, flexible shield made of electrically conductive material is provided which is compressed for placement into the plasma processing chamber, whereupon the shield expands from its compressed state so that it presses against the contours of the processing chamber walls. In a preferred aspect of the invention, the shield defines an aperture of a configuration generally matching an aperture of the processing chamber wall. An insert with sleeve-like portions presses into the aperture to protect the aperture from erosion, and to aid in positioning the shield against the chamber wall. In another preferred aspect of the invention, the shield is provided with at least one electrically conductive area. This electrically conductive area is connected to an electrically grounded portion of the chamber to maintain the shield at electrical ground. The insert engages the electrically conductive area for creating an electrical path from the shield to electrical ground. The electrical path may be completed or reinforced by connecting the insert to an electrically conductive grounding member which in turn is connected to a grounded structure inside the chamber.

DESCRIPTION OF THE PREFERRED EMBODIMENTS

The present invention is directed to an assembly for protecting the interior walls of a plasma processing chamber, which includes a flexible, one-piece, easy-to-install and remove shield, and elements aiding in its installation, positioning and electrical compatability within the the chamber interior. Generally, the shield is thin for flexibility and is configured to match the contours of the inside of the chamber. The diameter of the shield is somewhat larger than the diameter of the interior chamber walls so that, when installed inside the chamber, the shield is wedged into the chamber such that the outer surface of the shield is pushing firmly against and is positively engaging the facing surface of all interior chamber walls. The shield can be made of any electrically conductive material, upon which is preferably formed a protective coating of a substantially non-reactive material so that, when the shield is exposed to the plasma or gases, it will not create an undesirable effect on the process. Additionally, one or more small electrically conductive areas facing the interior of the chamber are located at various positions about the shield to provide an electrical path to positions of the chamber at a potential matching that of the walls.

Although the invention can be used in any type of plasma processing chamber, and can be of any shape or size generally corresponding to the shape and size of the interior walls, for ease of presentation the invention will be described in more detail as used in a plasma etch reactor, specifically the Applied Materials, Inc. Precision 5000 Etch System. This is not to limit the invention, but rather to provide a context from which the invention can be more readily understood.

Figure 1:
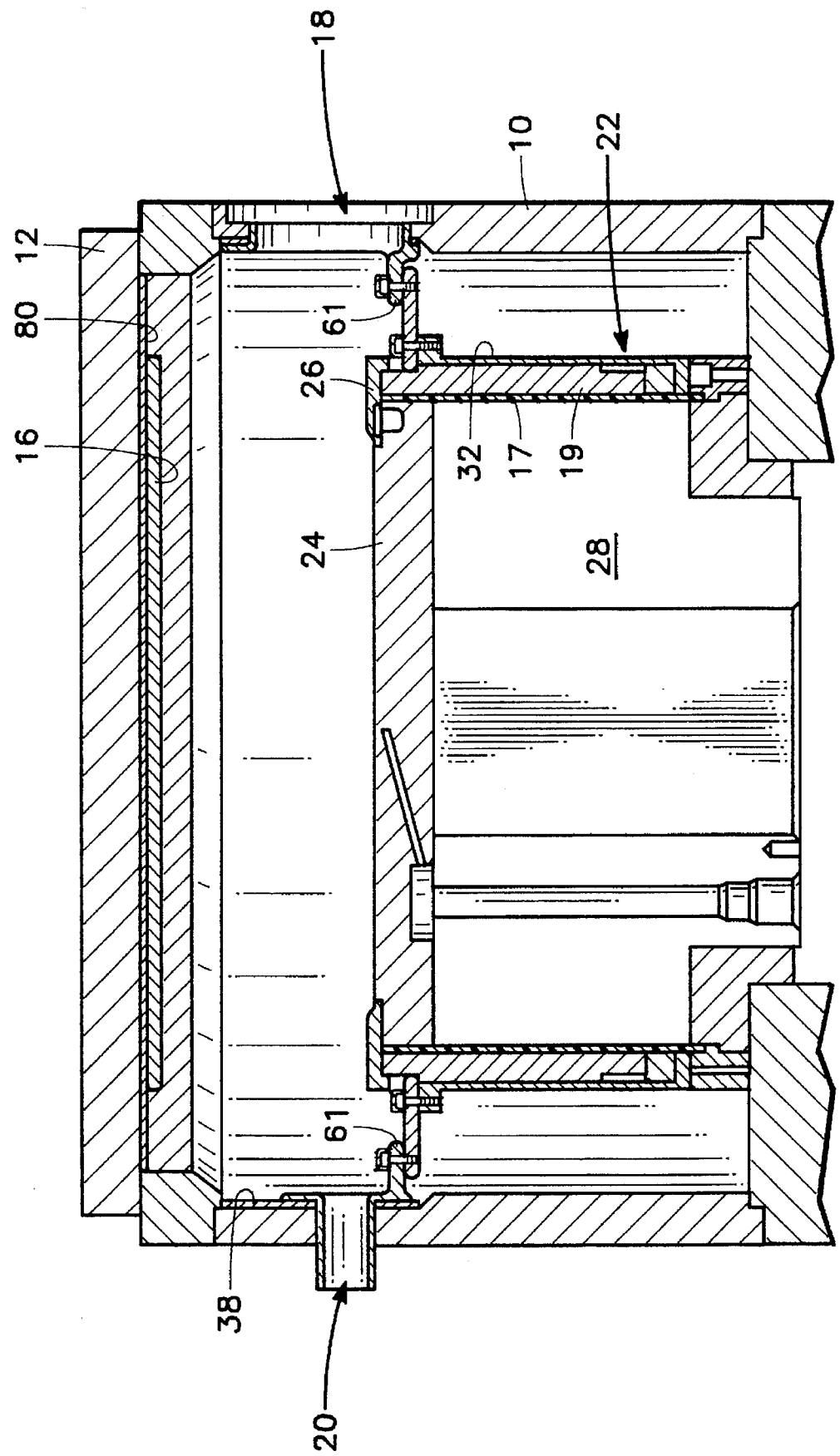
FIG. 1 is a side view in cross-section of the interior of a plasma processing chamber.

The Precision 5000 Etch System chamber, as shown in a sectional side view in FIG. 1, is based on a cylindrical vacuum chamber. The chamber walls 10 are made of solid aluminum, with water cooling channels extending within the insides of the walls. A lid 12 is attached to the walls by a hinge (not shown) to permit the lid 12 to be opened and closed for accessibility into the chamber interior from the top of the chamber. The lid, when closed, seals the top opening of the chamber and thus enables a vacuum to be maintained in the chamber. A circular, showerhead-type gas distribution plate 16 is attached directly to the lid. The process gas or gases are fed to the chamber through an inlet (not shown) to be evenly distributed through the gas distribution plate 16 over a substrate received in the chamber. All interior surfaces of the chamber lid 12 and walls 10 are anodized to minimize chemical reactivity and physical ion sputtering effects.

The otherwise smoothly cylindrical chamber wall is typically interrupted at two locations, namely for the window 18, and the slit valve aperture 20. The window 18 aperture is for viewing the plasma by human eye or monitoring via a process endpoint detector. The slit valve aperture 20 is the slot through which a substrate is carried on the blade of a robot arm for placement in and out of the processing chamber.

A processing platform 22 is positioned in the middle of the processing chamber for holding a substrate for processing. The processing platform includes a pedestal 24 on which the wafer is placed during processing. To maintain the position of the wafer in the chamber during processing, the pedestal 24 includes a wafer securing device to secure the wafer to the pedestal 24 temporarily during processing, such as an electrostatic chucking mechanism. Surrounding the pedestal 24 is an insulating quartz collar 26. The pedestal 24 is attached to a central intermediate member of the processing platform 22 which, in the Precision 5000 Etch System, is a solid aluminum cathode 28. Power, usually a radio frequency electric current, is coupled to the cathode. All other parts of the chamber are grounded. When gas is flowed into the processing chamber and the power is turned on, a plasma forms. The cathode 28 is surrounded by an insulating Teflon sleeve 17, which in turn is surrounded by a quartz sleeve 19, which in turn is surrounded by a grounding cylinder 32. As shown in the Figure, the grounding cylinder 32 is electrically insulated from the cathode 28 by the insulating sleeves 17 and 19. The cylinder 32 is preferably a generally cylindrical piece of aluminum, with anodization on all surfaces. The cylinder 32 is bolted to the chamber bottom so that it provides a grounding path for the walls of the chamber. A function of the grounding cylinder 32 is to form an electrical coupling assembly for the flexible shield, as will be described in detail below. On the bottom of the chamber surrounding the cylinder 32 is a pumping manifold (not shown) for exhausting the spent gases and reaction by products and sputtered material, with a pumping port (not shown) on the bottom of the processing chamber.

During processing the chamber walls are eroded, or worn, from chemical attack and ion bombardment of the walls as a secondary effect of plasma processing of a substrate inside the processing chamber. A typical plasma process is as follows. A substrate is placed onto the pedestal 24. Gas is flowed into the processing chamber while the chamber is maintained at a subatmospheric pressure. A corrosive gas, such as chlorine, may be included in the gas mixture. Power is applied to the cathode 28, and a plasma forms of the gas. Reactive gas species and sputtering ions impinge on the substrate to etch exposed areas of the substrate. The same reactive gas species and, to a lesser extent, the sputtering ions, also contact the walls of the chamber. After a number of processing runs, there is considerable wear and erosion of the chamber walls. Without a protection mechanism for the walls, the walls must eventually be replaced.

As mentioned previously, in the invention a flexible shield protects and thereby increases the lifetime of the chamber walls. As shown at 38 in FIG. 2, this shield is preferably a generally cylindrical, flexible, conductive band that substantially matches the shape of the chamber walls, with cutouts for the window 44 and slit valve opening 42. The shield 38 is formed to be very thin for flexibility, for example on the order of $\frac{1}{16}$ of an inch thick, and is preferably made of aluminum which is anodized on the outer surface. Shield 38 preferably is provided with a vertical discontinuity or gap which forms a vertical seam 45 when installed. The shield could also be provided in the form of a sheet of thin flexible conductor which is bent into position during insertion into the chamber. To prolong the lifetime of the anodization all edges of the shield are rounded. The shield 38 is of a diameter slightly larger than that of the walls (for example, about 0.5 to 1 inch larger diameter). The shield 38 can be flexed sufficently for placement within the chamber and for resilient positive engagement against the chamber walls 10. The gap which forms the seam 45 inside the chamber allows for the ends of the shield 38 at either end of the seam 45 to be crossed over one another to effectively compress the area of the shield 38 for passing the shield 38 through the opening at the top of the chamber which is slightly smaller in size than the chamber interior wall diameter. The seam 45, which in this embodiment is cut at the window opening 44, has a minimal gap where the ends of the shield 38 forming the seam 45 meet. The shield 38 extends downwardly from the top of the interior wall 10 to at least a position about halfway between the top of the interior wall 10 and the base of the wall. The lower half of the wall may be left uncovered because it is typically not exposed to the plasma. However, the shield 38 could be extended to reach down to the base of the wall.

Figure 2:
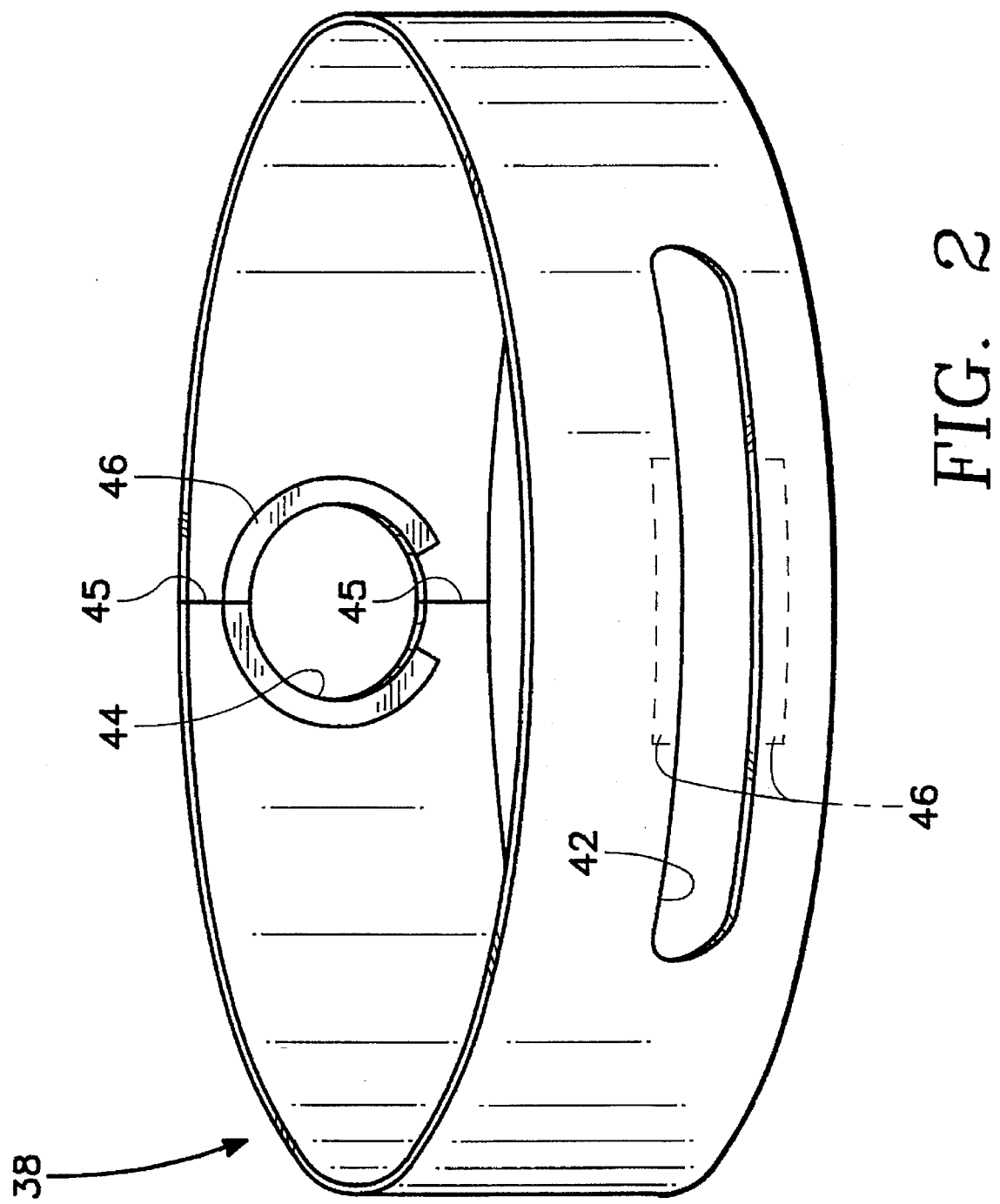
FIG. 2 is a view of the shield of the invention showing cutouts for the chamber window and slit valve aperture.
Figure 3:
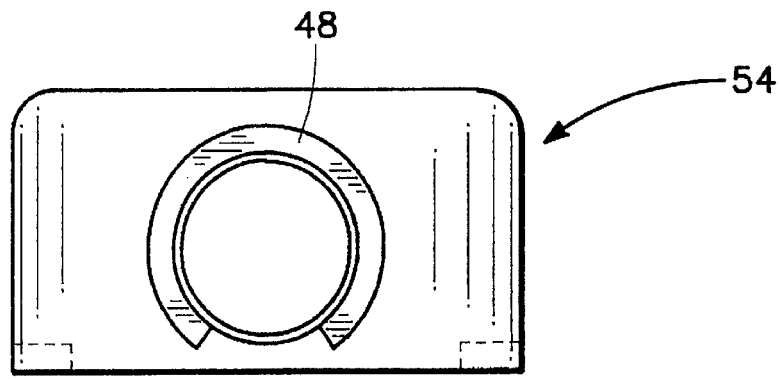
FIG. 3 is a front view of the window insert with exposed aluminum.
Figure 4:
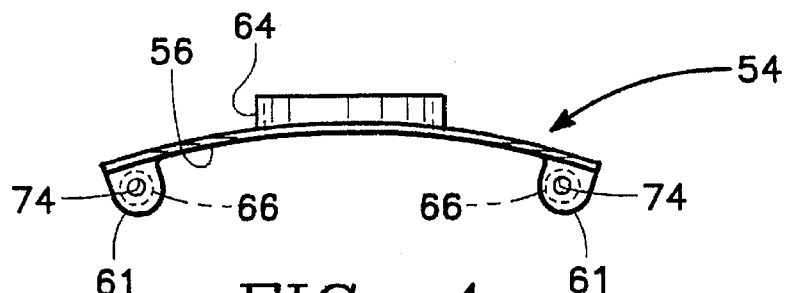
FIG. 4 is a top view of the window insert showing the curvature of the insert matching the curvature of the chamber walls and the tabs at the bottom of the window insert.
Figure 5:
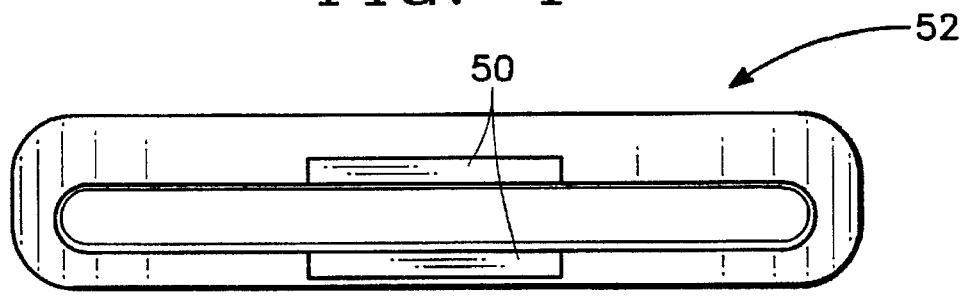
FIG. 5 is a front view of the slit valve insert with exposed aluminum.
Figure 6:
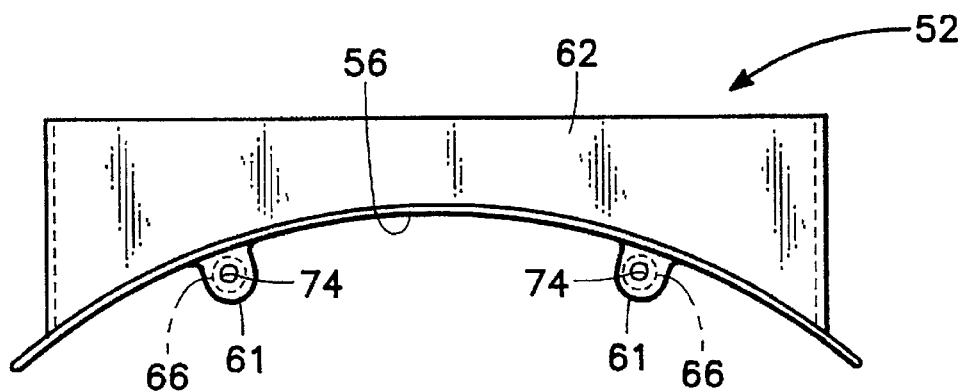
FIG. 6 is a top view of the slit valve insert showing the curvature of the insert matching the curvature of the chamber walls and the tabs at the bottom of the slit valve insert.

A conductive path must be provided between the shield 38 and the chamber wall 10 to insure that the chamber wall 10 and the shield 38 are at the same potential during the plasma processing. In the preferred embodiment of the invention this conductive path is provided by a conductive member to be described below between the shield 38 and walls 10 at the two apertures through the shield 38, i.e., the slit valve opening 42 and the window opening 44. As shown in FIG. 2, small areas 46 of the shield 38 immediately adjacent the window opening 44 and slit valve opening 42 are not anodized. These areas 46 of the exposed shield conductor will enable the conductive member to make good electrical contact with the shield 38 and thus provide an electrical path to ground for the shield. Providing an electrical path is necessary because the shield 38, if not otherwise connected electrically to the processing chamber walls 10, would electrically float in the plasma, accumulate charge, and thus create a risk of arcing. In the preferred embodiment, the conductive members are shown in FIGS. 3, 4, 5 and 6, comprising an insert piece 54 located at the window 44 and an insert piece 52 located at the slit valve 42 opening of the shield 38.

Each of the inserts 54 and 52 include a plate having a curvilinear profile matching the arc of the interior chamber wall 10 and a tubular sleeve 64 and 62 extending outwardly from the plate at an aperture through the plate. The edges of the plates are rounded, and the plates are sufficiently thin that after installation they will not jut out excessively into the chamber. The plates may be flexible like the shield, but in the preferred embodiment shown, they are rigid. The plates are sized so that upon installation, they overlap an area of shield 38, including overlapping unanodized shield areas 46. Upon installation the sleeves 64 and 62 extend through the chamber wall 10 into the window openings 44 and slit valve 42 openings. Insert pieces 54 and 52 with sleeves 64 and 62 protect the horizontally-extending wall surfaces of the window 18 and slit valve 20 apertures by covering these surfaces with the sleeves 64 and 62. Another function of the inserts 54 and 52 is to engage and interlock the shield 38 against the wall 10. Another function of the insert pieces 54 and 52 is to provide the needed electrically conductive path. The inserts 54 and 52 are made of aluminum, with anodization present on all surface areas of the inserts 54 and 52 except for those areas of exposed aluminum 48 (FIG. 3) and 50 (FIG. 5) that will, when the inserts 54 and 52 are pressed against the shield and chamber wall, match and engage the corresponding bare aluminum areas 46 on the shield 38 to insure a superior electrical path between the shield 38, the inserts 54 and 52, and the chamber wall 10.

Figure 7:
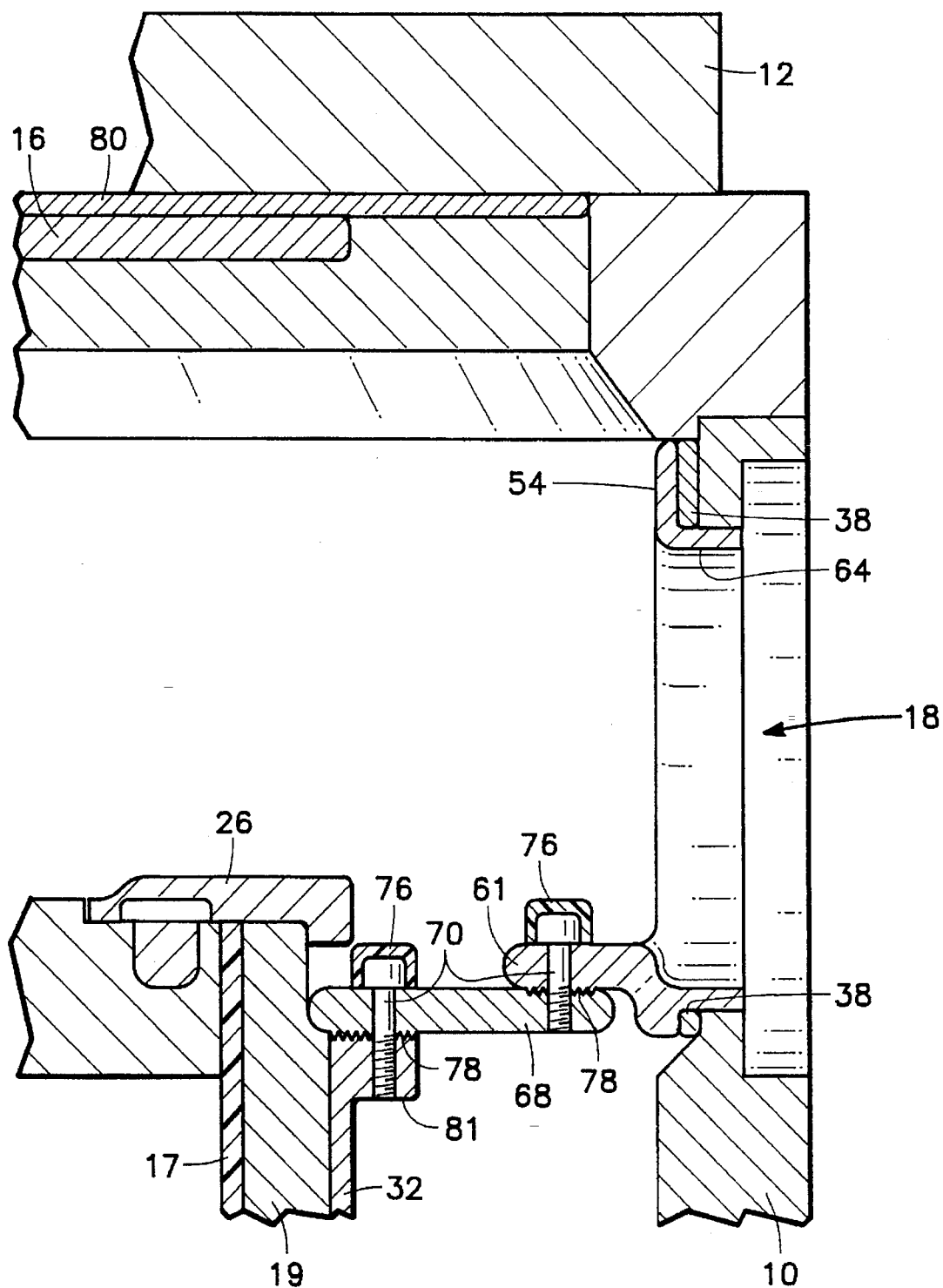
FIG. 7 is an enlarged side view of the shield and insert in the location of the window.
Figure 8:
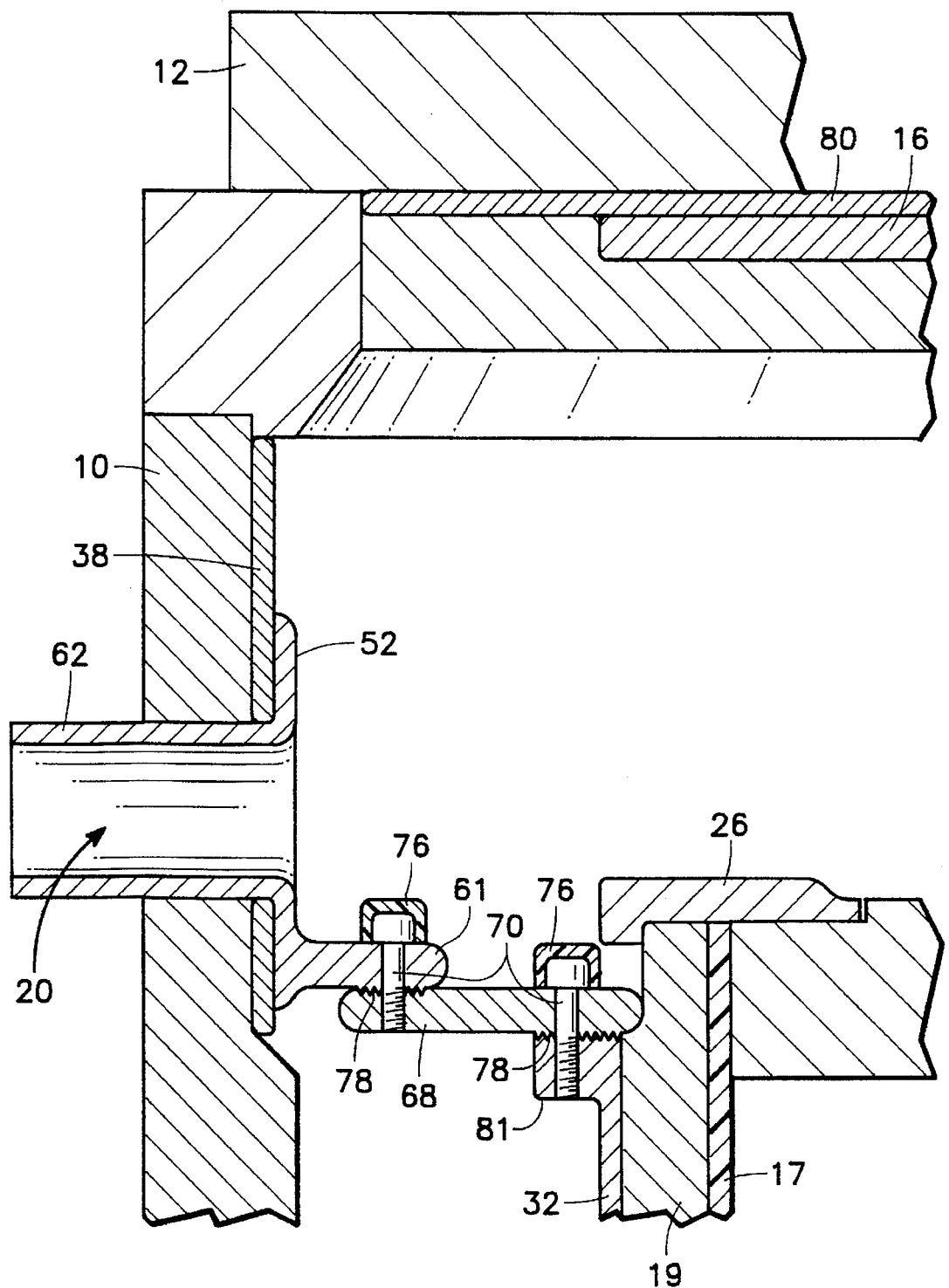
FIG. 8 is an enlarged side view of the shield and insert in the location of the slit valve.

To provide additional independent assurance that the chamber wall 10 and the shield 38 are grounded, each of the inserts 54 and 52 include tabs 61 extending therefrom inwardly of the chamber wall. Shown in FIGS. 7 and 8, which are enlarged side views of the window 18 and slit valve 20 aperture locations, respectively, within the processing chamber, tabs 61 are connected to grounding pieces 68 extending from the grounded cylinder 32. Each of the tabs 61 is also an aluminum member with anodization on the surface, except for the underside of each tab, which is not anodized. The grounding pieces 68 are rectangular in shape with rounded edges and are made of aluminum with anodization on their surfaces except for those portions thereof that contact the exposed aluminum undersides 66 (FIGS. 4 and 6) of the insert tabs 61. The grounding pieces 68 extend horizontally between the chamber wall 10 and the cylinder 32. Essentially, the grounding pieces 68 form a good electrical bridge from the shield 38 to ground. Each of the four grounding pieces 68 in the preferred embodiment is attached within the chamber at its two ends, one engaging the cylinder 32 at cylinder tab 81 and the other engaging an insert tab 61. Two screws 70 are used to hold each of the grounding pieces. One screw is inserted through the top of grounding piece 68 and secured within cylinder tab 81. The other screw is inserted through the top of a hole 74 in a tab 61 and screwed into the grounding piece 68, thereby securing the grounding piece 68 to the tab 61. Plastic caps 76, preferably made of Lexan or another electrical insulator, are placed on the heads of the screws 70 to prevent exposure of the screws 70 to the plasma. Electrically conductive shims 78 are used to adjust the height of the grounding piece at either end, as necessary. A superior electrical path is thereby created from the shield 38, and the chamber wall, to the inserts 54 and 52, through the insert tabs 61, and through the grounding pieces 68 to the grounded cylinder 32.

Another part of the processing chamber that is subject to wear and therefore desirable to protect is the ceiling of the chamber in the chamber lid 12. The gas distribution plate 16 covers most, but not all of the ceiling area of the chamber lid 12. The portion of the ceiling area not covered by the gas distribution plate 16 is subject to the same chemical reactions and sputtering from corrosive gases and the plasma as is experienced by the walls. To cover and thereby protect the uncovered area of the ceiling a flange extension 80 is built into the gas distribution plate 16, so that the total area of coverage of the ceiling is extended to the edges of the ceiling. The flange 80 essentially extends the area of the gas distribution plate 16 to cover the remainder of the ceiling that would be otherwise uncovered. The flange 80, like the gas distribution plate 16, is made of aluminum with anodization on all surfaces and all edges are rounded to prolong the lifetime of the anodization.

One important advantage of the shield 38 of the present invention is that it is easy to install. As we have seen, the construction of the shield allows the area embraced by the shield to be compressed sufficiently to allow the shield to be easily passed through the opening at the top of the chamber, even when that opening is slightly smaller in diameter than the interior walls 10. Once the shield 38 is received in the chamber, it is positioned to align the shield 38 to the window 18 and slit valve apertures 20 in the chamber with the window 44 and slit valve 42 openings in the shield 38. Sleeves 64 and 62 of the inserts 54 and 52 are then fitted into the window and slit valve openings, so that the inserts 54 and 52 are press contacted within the window 44 and slit valve openings 42 of the shield and are also contacted with the shield 38. The grounding pieces 68 are then attached underneath tabs 61 to the tabs 61 of inserts 54 and 52 and aligned with tabs 81 of cylinder 32, via screws 70. The grounding pieces 68 at one end are screwed into the tabs 81 of the cylinder 32. The opposite end of the grounding pieces 68 are fitted below tabs 61. Screws 70 are used to screw together the ends of the grounding pieces 68 with tabs 81 and 61. Electrically conductive shims 78 are inserted in the screw connections between the tabs 61 and grounding pieces 68, and tabs 81 and grounding pieces 68, as necessary to ensure a tight physical and electrical contact between shield 38 and inserts 54 and 52. Plastic caps 76 are pressed onto the screw heads. The wall shield 38 is then firmly secured in place, all electrical grounding paths are well secured, and the chamber lid 10 can be closed and readied for plasma processing.

After a number of plasma processing runs, the shield and inserts can likewise be easily removed and discarded. Any negative impact of the plasma process upon the hardware of the chamber interior is borne by the relatively inexpensive shield and its associated components, which can be quickly cleaned outside the chamber or changed, to restore operation with little expense and downtime.

We claim:

1. An apparatus for protecting the interior walls of a plasma processing chamber, said interior walls being at an electrical potential, comprising:

a removable, flexible shield comprising electrically conductive material, said shield having a first surface resiliently engaging the contours of the interior walls;

an electrically conductive area defined on a second surface of said shield; and at least one electrically conductive member distinct from the shield engaging said conductive area to electrically couple said shield to an electrical potential substantially matching the electrical potential of the interior walls of the chamber.

2. An apparatus as in claim 1, wherein said flexible shield is of a circumferential dimension that is larger than the circumferential dimension of the interior walls.

3. An apparatus as in claim 1, wherein said electrically conductive member includes an electrically conductive insert member pressed against the shield thereby holding the shield against the interior walls.

4. An apparatus as in claim 3, wherein said insert member engages said conductive area and a portion of the interior walls of said chamber, whereby the walls and the shield are reliably maintained at substantially the same electrical potential.

5. An apparatus as in claim 4, wherein said interior walls define a first aperture, said shield defines a second aperture, and said insert member engages and electrically couples said shield to said walls via said apertures while fixing said shield in position against the walls.

6. An apparatus as in claim 5, further comprising an electrically conductive member extending between said insert and an interior chamber structure spaced from the interior walls engaged by said shield, additionally insuring that the interior walls and the shield will be maintained at substantially the same electrical potential.

7. An apparatus as in claim 3, further comprising a removable electrically conductive member attached to the electrically conductive insert member so as to form an electrical bridge between the electrically conductive insert member and a chamber structure having an electrical potential substantially matching said electrical potential of the interior walls.

8. An apparatus as in claim 1, wherein said interior walls are at electrical ground potential.

9. An apparatus as in claim 1, wherein said shield defines a surface facing the interior of said chamber upon which is formed a substantially non-reactive coating.

10. An apparatus as in claim 9, wherein said coating is an anodization.

11. An apparatus as in claim 1, wherein said shield defines a discontinuity which enables the ends of the shield adjacent said discontinuity to be overlapped when the shield is compressed.

12. An apparatus as in claim 11, wherein said discontinuity is of a width such that, when the shield is pressed against said interior walls, the discontinuity forms a seam with a minimum spacing between the ends abutting the seam.

13. An apparatus for protecting the interior walls of a plasma processing reactor chamber, said processing chamber having within the processing chamber a structure comprising an electrical coupling assembly at an electrical potential substantially matching the electrical potential of the interior walls, said apparatus comprising:

a removable, flexible shield comprised of electrically conductive material and having a first surface that presses against the contours of the interior walls, said shield including at least one electrically conductive area facing the interior of the processing chamber;

at least one removable electrically conductive insert, wherein each electrically conductive area of the flexible shield is pressed against by a separate insert so as to hold the shield in place against the interior walls thereby electrically coupling said insert to said shield, each insert including an extension electrically coupled to said electrical coupling assembly of said processing chamber, so that each insert, said shield, and said walls are maintained at a substantially matching electrical potential so as to avoid plasma arcing.

14. An apparatus as in claim 13, wherein said interior walls define a first aperture, said shield defines a second aperture, and said insert locks said shield into position against the interior walls via said first and second apertures.

15. A method of protecting the interior walls of a plasma processing reactor chamber, comprising the steps of:

placing a removable, electrically conductive, flexible shield of a diameter larger than the diameter of the interior walls within the plasma processing chamber;

rotating the shield so that it is aligned with the contours of the interior walls;

interlocking the shield against the chamber via an electrically conductive insert that is attached against the shield;

attaching a first end of an electrically conductive member to said insert to form a first end of an electrically conductive path; and attaching a second end of said electrically conductive member to an electrically grounded area of the plasma processing chamber so as to form an electrically conductive path between the shield and the electrically grounded area of the plasma processing chamber.

16. A chamber liner assembly for a plasma processing chamber having an arcuate interior wall, said wall defining at least one aperture, said assembly comprising;

a thin, resilient band of conductive material sized for insertion over and about at least a substantial portion of the area of said arcuate wall, said band adapted upon insertion to press against said wall in resilient contact thereto and to define an aperture generally matching said chamber aperture;

an insert defining a sleeve portion of an outside configuration matching the shape of said chamber aperture, and a flanged portion at one end of said sleeve portion adapted to overlap and engage a portion of said band; and a protective layer upon areas of the surface of said band exposed to the processes within the chamber;

said band being insertable into said chamber so as to align said apertures, said insert being insertable into said chamber wall through said apertures to interlock said band, chamber wall and insert and maintain the position of said band against said wall, while providing a positive electrical connection between said band and chamber wall to maintain both at the same electrical potential, thereby to minimize arcing and protect said chamber wall during plasma processing, said band and insert being capable of disassembly and replacement as desired.

17. The assembly of claim 16, in which an inwardly facing surface of said band includes said protective layer over all portions thereof except for a small area immediately adjacent said band aperture, and in which said flanged portion of said insert engages and fully overlaps said small area.

18. The assembly of claim 17, in which said protective layer comprises an anodization.

19. The assembly of claim 16, in which the insert, band, and the chamber wall are maintained at ground potential.

20. The assembly of claim 16, in which the insert is of the same material as the chamber wall.

21. The assembly of claim 16, in which said chamber further includes a central pedestal support assembly for supporting a workpiece to be processed within said chamber, said support assembly including a grounded perimeter member, said liner assembly further including at least one auxiliary electrical connection between said enlarged portion of said insert and said grounded perimeter member.

22. The assembly of claim 16, which further includes an electrical extension connector between said insert and a portion of the chamber not covered by said band.

23. The assembly of claim 16, in which said band is a continuous strip of circumference at least equal to that of said chamber wall.

24. The assembly of claim 16, in which said band is discontinuous, and of a length at least as great as the circumference of said chamber wall.

25. The assembly of claim 24, in which said discontinuous band defines matching cutout portions at its respective ends, said ends and cutout portions upon insertion of said band into said chamber abutting to define said aperture within said band matching said chamber aperture.

26. An assembly for protecting the interior walls of a plasma processing chamber which defines a recess, said assembly comprising:

a removable, flexible shield comprised of electrically conductive material, said shield pressing against the contours of the interior walls, said shield including an electrically conductive area facing the interior of the processing chamber, said shield defining an aperture adjacent said conductive area; and at least one removable electrically conductive insert engaging said electrically conductive area of the flexible shield and the interior walls via said aperture and recess to hold said shield in place against the interior walls, and to electrically couple said shield, insert and walls and maintain the same at a substantially matching electrical potential, so as to prevent plasma arcing stemming from use of said shield.

27. An assembly as in claim 26, in which said insert is provided with an extension reaching to an interior structure spaced from said recess and at the same electrical potential as said walls, to further insure that said shield and walls are at matching electrical potential.

28. An assembly as in claim 26, in which said recess is an aperture, and said insert defines a hollow sleeve to protect the exposed surfaces of said aperture.

29. An assembly as in claim 26, which further includes a protective coating formed on portions of the shield surface facing the interior of the processing chamber which are not a part of said conductive area.

* * * * *